(12) United States Patent
Ge

(10) Patent No.: US 11,769,544 B2
(45) Date of Patent: Sep. 26, 2023

(54) CODE COMPARATORS WITH NONPOLAR DYNAMICAL SWITCHES

(71) Applicant: TETRAMEM INC., Newark, CA (US)

(72) Inventor: Ning Ge, Newark, CA (US)

(73) Assignee: TetraMem Inc., Fremont, CA (US)

( * ) Notice: Subject to any disclaimer, the term of this patent is extended or adjusted under 35 U.S.C. 154(b) by 236 days.

(21) Appl. No.: 16/153,675

(22) Filed: Oct. 5, 2018

(65) Prior Publication Data

US 2020/0111518 A1   Apr. 9, 2020

(51) Int. Cl.
*G11C 11/24* (2006.01)

(52) U.S. Cl.
CPC .................................. *G11C 11/24* (2013.01)

(58) Field of Classification Search
CPC ..... G11C 5/063; G11C 16/0466; G11C 11/24; G11C 11/5685; G11C 13/0007; G06F 21/79
See application file for complete search history.

(56) References Cited

U.S. PATENT DOCUMENTS

| 2013/0343114 | A1* | 12/2013 | Carter  | G11C 13/0069 365/148 |
| 2014/0003139 | A1* | 1/2014 | Pickett | G11C 13/0069 365/159 |
| 2017/0243109 | A1* | 8/2017 | Hu | G06N 3/0635 |
| 2019/0221261 | A1* | 7/2019 | Ge | H10B 63/30 |
| 2020/0083440 | A1* | 3/2020 | Hersam | H10B 63/82 |
| 2020/0235105 | A1* | 7/2020 | Sharma | H01L 27/1116 |
| 2020/0372957 | A1* | 11/2020 | Sharma | G11C 16/26 |

\* cited by examiner

*Primary Examiner* — Tha-O H Bui
(74) *Attorney, Agent, or Firm* — Jaffery Watson Mendonsa & Hamilton LLP

(57) ABSTRACT

Code comparators with nonpolar dynamical switches are provided. An example apparatus comprises: a plurality of row wires; a plurality of column wires; one or more cross-point devices, and a nonpolar volatile two-terminal device formed within a plurality of cross-point devices. Each cross-point device in the plurality of cross-point devices is located at a cross-point between a row in the plurality of row wires and a column in the plurality of column wires; the nonpolar volatile two-terminal device is configured to automatically revert from an ON state to an OFF state, in response to a removal of a bias or signal applied on the nonpolar volatile two-terminal device. The nonpolar volatile two-terminal device is configured to automatically revert from an ON state to an OFF state, in response to a removal of a bias or signal applied on the nonpolar volatile two-terminal device.

13 Claims, 5 Drawing Sheets

CODE COMPARATORS WITH NONPOLAR DYNAMICAL SWITCHES

TECHNICAL FIELD

The present disclosure generally relates to code comparators and more specifically relates to code comparators with nonpolar dynamical switches.

BACKGROUND

Hamming distance may be calculated by a digital circuit through a bit-wise comparison of incoming data bits with the corresponding decision logic. Because power consumption by a digital circuit is proportional to circuit capacitance and the total number of signal transitions, the efficiency for calculating Hamming distance in a digital circuit may be low. This difficulty is exacerbated when the word or string comparison involves an analog input signal, which needs to be converted to digital signal first via an analog to digital converter (ADC).

Technical challenges, therefore, remain for providing a low cost, low energy requirement, and higher-speed switching circuit.

SUMMARY

Systems and methods of operating a code comparator using a nonlinear device (for example, a nonpolar dynamical two-terminal device in a crossbar array) are disclosed. For example, after being switched by an electrical bias to a low resistance state, i.e., an ON state, a nonpolar dynamical two-terminal device returns to its high resistance state, i.e., an OFF state, automatically upon the removal of the switching electrical bias. In this sense, the device may be called volatile in its OFF state.

An example apparatus comprises: a plurality of row wires; a plurality of column wires; one or more cross-point devices, and a nonpolar volatile two-terminal device formed within a plurality of cross-point devices. Each cross-point device in the plurality of cross-point devices is located at a cross-point between a row in the plurality of row wires and a column in the plurality of column wires; the nonpolar volatile two-terminal device is configured to automatically revert from an ON state to an OFF state, in response to a removal of an electrical bias or signal applied on the nonpolar volatile two-terminal device. The nonpolar volatile two-terminal device is configured to automatically revert from an ON state to an OFF state, in response to a removal of a bias or signal applied on the nonpolar volatile two-terminal device. The example apparatus is configured to automatically revert from the ON state to the OFF state within 1 millisecond after the bias or signal applied on the nonpolar volatile two-terminal device is removed.

In some implementations, the nonpolar volatile two-terminal device is configured to automatically revert from the ON state to the OFF state within between 100 picoseconds and 100 milliseconds after the bias or signal applied on the nonpolar volatile two-terminal device is removed.

In some implementations, the nonpolar volatile two-terminal device has a nonlinearity ratio higher than 10, wherein the nonlinearity ratio is defined as a first current applying with a turn-on voltage of the nonpolar volatile two-terminal device divided by a second current applying with half of the turn-on voltage.

In some implementations, the nonlinearity ratio is higher than 100 when a number of the plurality of row wires and that of the plurality of column wires are more than 10.

In some implementations, the nonpolar volatile two-terminal device is composed of at least one of: $NbO_2$, $VO_2$, $SmNO_3$, $Ti_2O_3$, $Ti_3O_5$, $LaCoO_3$, $V_4O_7$, $NdNiO_3$, $V_6O_{11}$, real-earth metal oxide, $AM_4Q_8$ (wherein A=Ga, Ge; M=V, Nb, Ta; Q=S, Se), and a Mott material.

In some implementations, the nonpolar volatile two-terminal device includes a Metal-Insulator-Metal (MIM) component, wherein the MIM component includes a dielectric layer doped by a diffusive metal, and wherein the diffusive metal is one of: Ag, Cu, and Li.

In some implementations, the nonpolar volatile two-terminal device includes a Metal-Insulator-Metal (MIM) component, wherein the MIM component includes a dielectric layer doped by a fast diffusive metal.

In some implementations, the fast diffusive metal is one of: Ag, Cu, Au, Al, and Li.

In some implementations, the nonpolar volatile two-terminal device includes a Metal-Tunnel Barrier-Metal (MBM) component, wherein the MBM component includes a dielectric layer, and wherein the dielectric layer includes one of: oxides, nitrides, carbides, and sulfides.

An example method of operating one or more cross-point devices including: programming a crossbar array with a first input signal through a first end of the crossbar array, wherein the crossbar array includes one or more cross-point devices; reading a first output signal; removing a signal or bias applied to the crossbar array; determining that a predefined amount of time has passed after the signal or bias is removed; and programming, without resetting the one or more cross-point devices, the crossbar array with a next input signal.

In some implementations, the method further comprises: programming the crossbar array with a reference signal, wherein the reference signal is applied through a second end of the crossbar array.

In some implementations, the method further comprises: applying a ground voltage to the second end of the crossbar array when reading the first output signal.

In some implementations, the predefined amount of time is configured to allow the one or more cross-point devices to transition back to their original state.

In some implementations, the original state is an OFF state.

In some implementations, the predefined amount of time is between 100 picoseconds and 100 milliseconds.

In some implementations, the method further comprises: comparing a voltage difference between the input signal and the reference signal, wherein the one or more cross-point devices are configured to switch to an ON state in accordance with a determination that the voltage difference is greater than or equal to a threshold switching voltage associated with the one or more cross-point devices.

In some implementations, the one or more cross-point devices are configured to switch to an OFF state in accordance with a determination that the voltage difference is lower than the threshold switching voltage associated with the one or more cross-point devices.

Figure 2A:
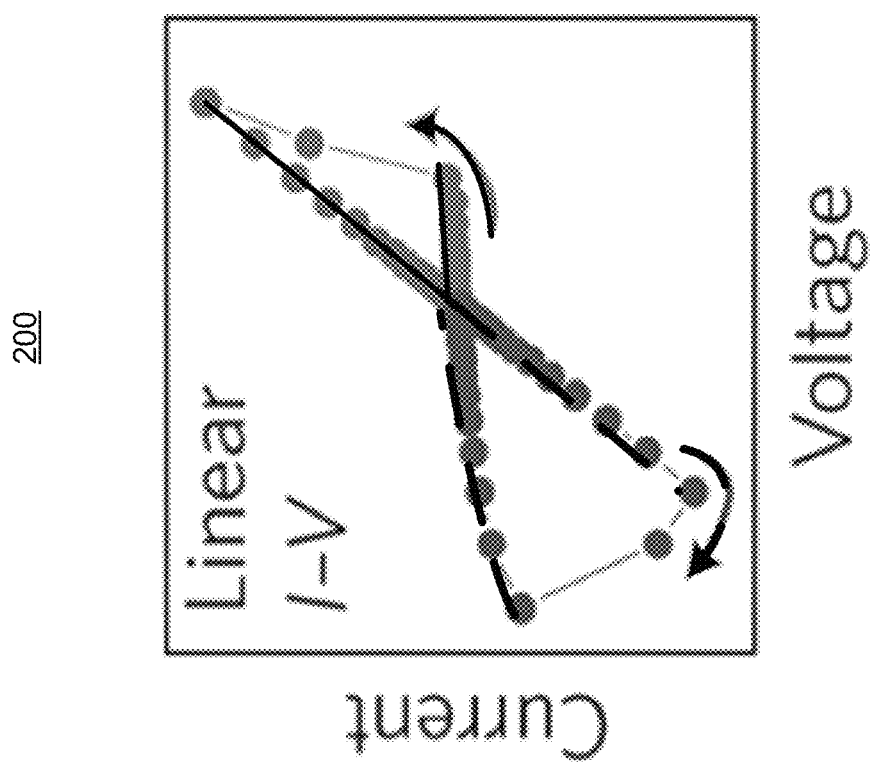
FIGS. 2A and 2B are block diagrams illustrating example characteristics of nonvolatile memristors.
Figure 2B:
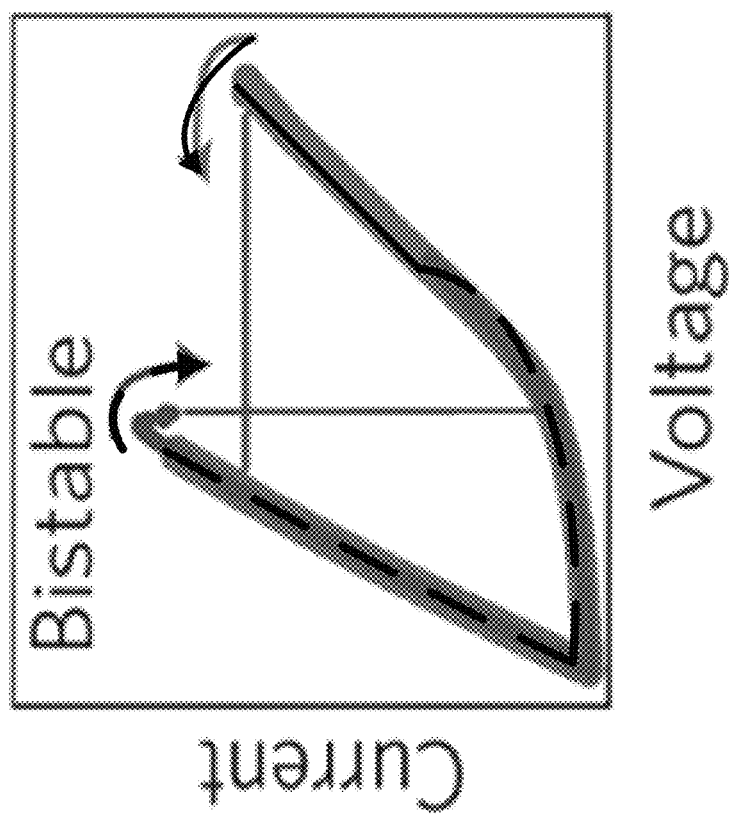

The broken lines and solid lines illustrated in the FIGS. 2A, 2B, and 3C represent different states (a high resistance state or a low resistance states, for example) of a nonpolar volatile device.

The implementations disclosed herein are illustrated by way of example, and not by way of limitation, in the figures of the accompanying drawings. Like reference numerals refer to corresponding parts throughout the drawings.

DETAILED DESCRIPTION

Code comparator with nonpolar switches and methods for using the same are provided. The technologies described in the present disclosure may provide the following technical advantages. First, the technologies described in the present disclosure do not require digital addition or comparison and are capable of determining Hamming distance as well as carrying out code comparison using analog signals.

Second, technologies described in the present disclosure may improve switching speed by reducing or eliminating overhead incurred by having to re-program or reset a non-linear device to its default state, for example, at the end of each comparison operation.

Third, technologies described in the present disclosure may enhance the accuracy of comparison results by providing a threshold switching voltage, which may be set and adjusted to desired values that are more noise tolerant.

In a code comparison operation, the Hamming distance between two strings of equal length is defined as the total number of positions at which the corresponding symbols are different from each other. In other words, the Hamming distance measures the minimum number of substitutions required to change one string into the other or the minimum number of errors that could have transformed one string into the other. Hamming distance may be applied to in information theory, coding theory, and cryptography. Hamming distance may, for example, be used to estimate the number of errors in signals (e.g., signal quality) by counting the number of flipped bits in a fixed-length binary word.

To calculate Hamming distance, strings or words may first be converted into sequence code based on binary bits. A Hamming distance comparator within a digital circuit system may count the total number of binary bit flips between two strings. Using two 8-bit-streams as an example, the Hamming distance between 01101001 and 10101000 is three, e.g., a first flip in the first bit, a second flip in the second bit, and a third slip in the eighth bit. Hamming distance may be calculated by digital circuits having XOR gates performing a bit-wise comparison of the incoming data bits and the corresponding decision logic. Because power consumption by a digital circuit is proportional to circuit capacitance and the total number of signal transitions, the efficiency for calculating Hamming distance in a digital circuit may be low. This difficulty is exacerbated when the word or string comparison involves an analog input signal, which needs to be converted to a digital signal first via an analog to digital converter (ADC).

Figure 1:
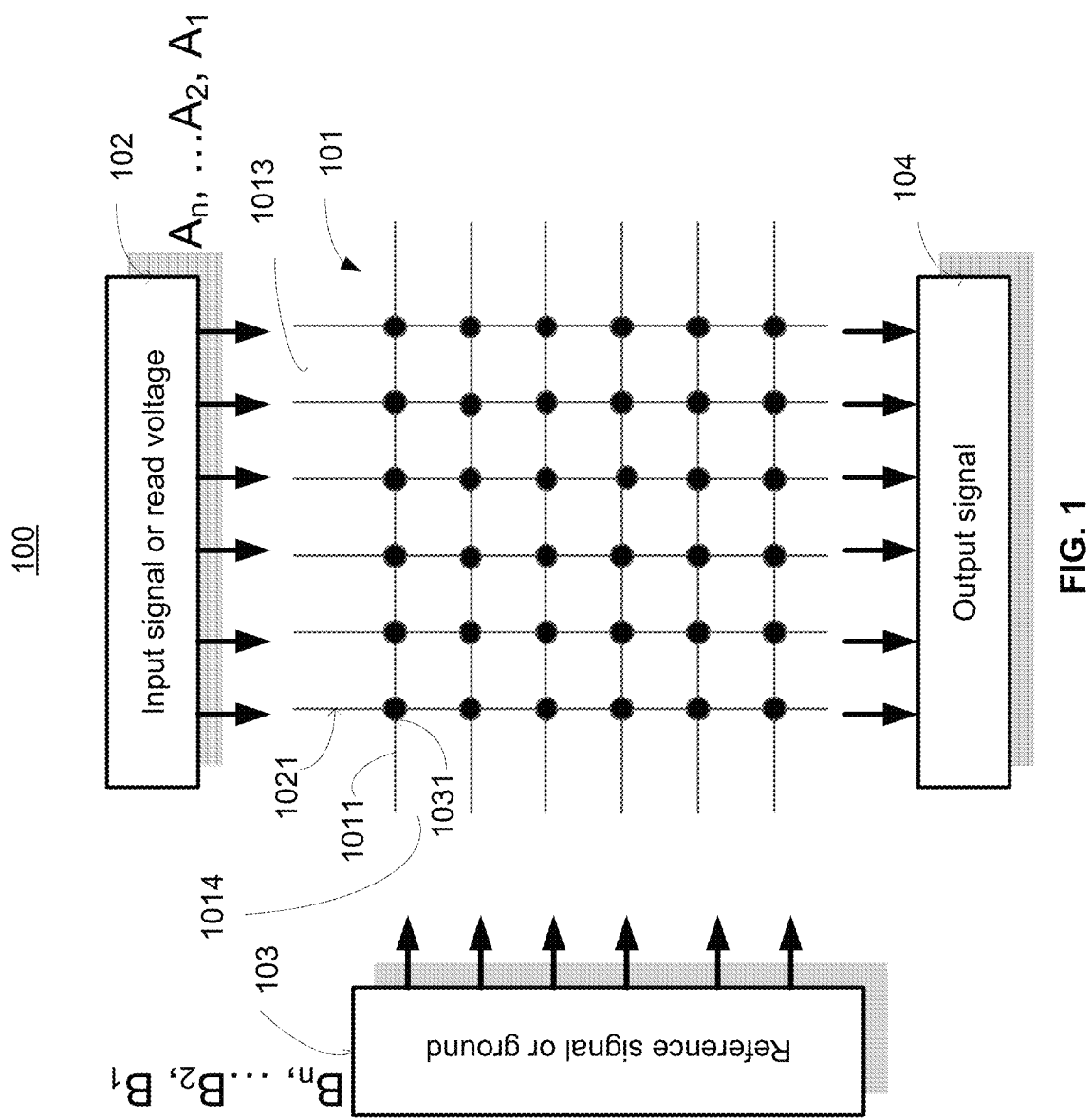
FIG. 1 is a block diagram illustrating an example crossbar array-based code comparator in accordance with some implementations.

FIG. 1 is a block diagram illustrating an example crossbar array-based code comparator 100 in accordance with some implementations. As shown in FIG. 1, the crossbar array circuit 100 includes a crossbar array 101 with a first row wire 1011, a first column wire 1021, and a cross-point device 1031. In some implementations, the row wires (e.g. the first row wire 1011), the column wires (e.g. the first column wire 1021), or both, are metal wires.

Cross-point devices (cross-point switches) are switches arranged in a matrix configuration. A crossbar device may have multiple input and output lines that form a crossed pattern of interconnecting lines between which a connection may be established by closing a switch located at each intersection, the elements of the matrix.

Based on conditions on which an electrical switching may occur, a two-terminal cross-point device 1031 may be classified into two categories: a bipolar switching and a unipolar (or nonpolar) switching. Bipolar switching occurs when one voltage polarity (e.g., +1V) is used for Set switching while the opposite voltage polarity (e.g., −1V) needs to be used for Reset switching. In contrast, the Set and Reset in unipolar or nonpolar switches may occur when voltages with the same polarity are applied. For example, a Set may occur when a +1V is applied and a Rest may occur when another +1V is applied.

FIGS. 2A and 2B are block diagrams illustrating example characteristics 200 and 230 of nonvolatile memristors, respectively. As shown in FIG. 2A, bipolar switches, e.g., memristors, require one voltage polarity to switch ON and the opposite voltage polarity to switch OFF. In contrast, as shown in FIG. 2B, nonpolar switches may be switched ON and OFF with the same voltage polarity, as shown in FIG. 2B.

Figure 2C:
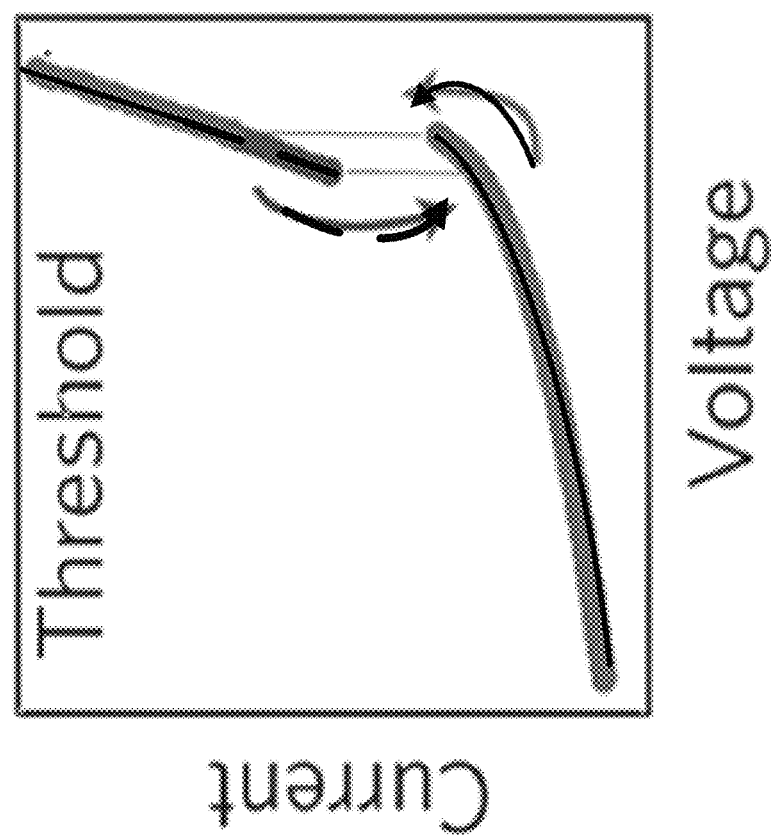
FIG. 2C is a block diagram illustrating example characteristic of a nonpolar volatile device in accordance with some implementations.

FIG. 2C is a block diagram illustrating example characteristic of a nonpolar volatile device 260 in accordance with some implementations.

As shown in FIG. 2B, a volatile device 260 may automatically reset, e.g., reverting back to a high resistance state when the applied electrical bias is removed, i.e., under a low or zero electrical bias. Such a volatile device may have a nonlinear current-voltage relation in a current-voltage plot, i.e., a low current below a certain threshold voltage, and a high current when the applied voltage becomes greater than a predefined threshold value, regardless of the voltage polarities. In other words, whether the applied voltage is a positive voltage or a negative voltage is irrelevant. Therefore, a nonpolar volatile device may have a simpler architecture for providing Hamming distance computations and requires less energy.

In some implementations, the cross-point device 1031 includes a nonpolar volatile two-terminal device. A nonpolar device may be switched between the ON state and the OFF state with either voltage polarity. A volatile device may be switched to the OFF state (a relatively high resistance state) automatically upon removal of an applied electrical bias or signals, i.e., under a low or zero electrical bias. The resistance of the nonpolar volatile two-terminal device may be electrically switched between two states: a High-Resistance State (HRS) and a Low-Resistance State (LRS). The switching from the HRS to the LRS may be referred to as "Set" or "On". Conversely, the switching from the LRS to the HRS is called "Reset" or "Off". In some implementations, a nonpolar volatile two-terminal device may be switched from ON to OFF upon removal of the applied electrical bias or signals within 1 millisecond.

In some implementations, a nonpolar volatile two-terminal device has a nonlinearity ratio higher than 10. A nonlinearity ratio may be defined as a first current obtained on the device applied with a turn-on voltage of the nonpolar volatile two-terminal device divided by a second current obtained on the device applied with half of the turn-on voltage.

In some implementations, where the crossbar array 101 is an N×N array (an array that includes N rows and N columns) and N is greater than 10, the nonlinearity ratio is higher than 100. In other word, the nonlinearity ratio may be higher than 100 when total number of the plurality of row wires and that of the plurality of column wires are greater than 10.

To configure a nonpolar volatile two-terminal device for code comparing operation, the following components may be used:

A Mott Transition Device

The composition of a cross-point device 1031, in some implementations, includes $NbO_2$, $VO_2$, $SmNO_3$, $Ti_2O_3$, $Ti_3O_5$, $LaCoO_3$, $V_4O_7$, $NdNiO_3$, $V_6O_{11}$, real-earth metal oxide, or any Mott materials such as $AM_4Q_8$ (wherein A=Ga, Ge; M=V, Nb, Ta; Q=S, Se). A cross-point device made of one or more of these materials will be in a high resistance state (e.g. 1MΩ), when low bias or signal (e.g. 0.2V) is applied. When a threshold voltage (e.g. 2V) or current is applied, however, such a cross-point device may be heated (by the current flow through the cross-point device) and, as a result of the heating effect, transition into a low resistance state (e.g. 100Ω). After removal of the bias, the temperature of the cross-point device 1031 may be cooled down, and the resistance of the cross-point device reverts back to the high resistance state.

A Metal-Insulator-Metal (MIM) Device

In some implementations, a cross-point device 1031 includes a Metal-Insulator-Metal device or component. In some implementations, the MIM device includes a dielectric layer doped by a diffusive metal, such as Ag, Cu, or Li. When a low bias or signal or no bias or signal is applied, such a cross-point device remains in a high resistance state (e.g. 1MΩ), since the diffusive metal does not form a complete conducting path to bridge the two metal electrodes. When a threshold voltage (e.g. 2V) or current is applied, the diffusive metal in the cross-point device may be transformed into a filament in the dielectric layer to electrically connect the two metal electrodes. The cross-point device may therefore transition into a low resistance state (e.g. 100Ω), because the formation of the conductive bridge. Once the bias is reduced or removed, the diffusive metal transitions back into its original state, disconnecting the two metal electrode, driven by thermodynamics through some electrochemical processes. The resistance of the cross-point device may therefore revert back to a high resistance state without the need of applying a programming signal or bias.

A Metal-Tunnel Barrier-Metal (MBM) Device

In some implementations, the composition of a cross-point device 1031 includes a Metal-Tunnel Barrier-Metal device or component. In some implementations, the MBM device includes a dielectric layer, and a material of the dielectric layer includes oxides, nitrides, carbides, and sulfides. In the present embodiment, when a low bias or signal or no bias or signal is applied, such a cross-point device remains in a high resistance state (e.g. 1MΩ), because the dielectric layer is insulating. When a threshold voltage (e.g. 2V) or current is applied, however, the barrier in the dielectric layer of the cross-point device 1031 may be tunneled through by electrons or other particles. Due to tunneling effects, the cross-point device may transition into a low resistance state (e.g. 100Ω). After the voltage is reduced or removed, however, the cross-point device automatically reverts back to the high resistance state without the need of any programming signal or bias being applied. This is because, once the bias is removed, the energy profile of the tunnel barrier recovers and as a result, the tunneling effect ceases to exist.

Figure 3:
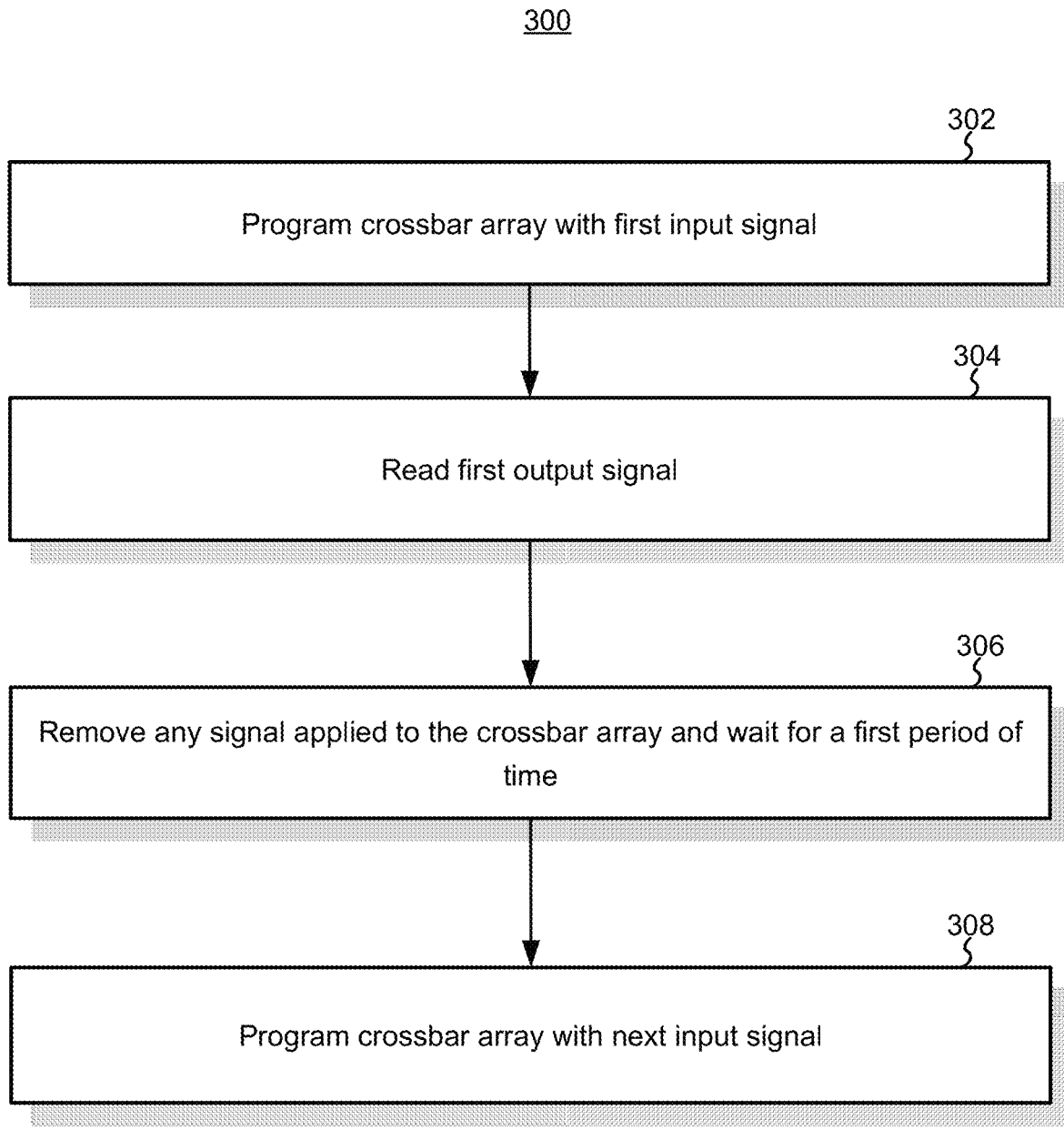
FIG. 3 is a flowchart illustrating an example method 200 for calculating analog Hamming distance using a crossbar circuit in accordance with some implementations.

FIG. 3 is a flowchart illustrating an example method 300 for calculating analog Hamming distance using the crossbar circuit 101 in accordance with some implementations. As shown in FIG. 3, the method 300 includes programming the crossbar array 101 with a first input signal 102 (step 302), reading a first output signal 104 (step 304), and removing a signal or bias applied to the crossbar array 101 and waiting for a first predefined period of time (step 306). To repeat the computation process, the method 300 further includes programming the crossbar array 101 with a next input signal (step 308).

In a more detailed example, as shown in FIG. 1, the first input signal 102 may be applied to a first end 1013 of the crossbar array 101, and a reference signal or ground 103 may be applied to a second end 1014 of the crossbar array 101.

To calculate a Hamming distance between two bit strings, the bit strings (e.g. an input signal string $A_n \ldots A_2 A_1$ and a reference signal string $B_n \ldots B_2 B_1$) are provided, with corresponding voltage levels (by way of either digital signals or analog signals), to the rows and the columns, respectively, as shown in FIG. 1.

During the switching process, if bit $A_n$ and bit $B_n$ have the same voltage level or, alternatively, the voltage difference between these two is less than the threshold switching voltage, the n-th Row (e.g. the first row) and the n-th column (e.g. the first column) of the cross-point device (e.g. the cross-point device 1031) may remain in a High Resistance State, because the two terminals of the cross-point device are of an "equal" (or close-enough) potential. If bit $A_n$ and bit $B_n$ have a voltage difference greater than the threshold switch voltage, however, the cross-point device may transition into a Low Resistance State, with the compliance current applied either in rows or columns current path.

After the switching (or non-switching) process, a small read voltage may be applied to the columns and the rows may be grounded; alternatively, the read voltage may be applied to the rows and the columns may be grounded.

The first output signal 104 including the overall summed current from the crossbar array 101 may then be read. The Harming distance may then be calculated in accordance with the summed current using a Trans-Impedance Amplifier (TIA) and an Analog-to-Digital Converter (ADC) peripheral circuit.

After the first output signal 104 is read, the signal or bias applied to the crossbar array 101 may be removed.

A predefined amount of wait time may be needed before the next operation takes place, so that the cross-point devices is allowed to transition from the current ON state or the LRS back to the original state (e.g., the OFF state or the HRS). In some implementations, the predefined amount of wait time is 1 millisecond to allow all cross-point devices within a crossbar array to revert back to the OFF state.

At the end of the wait time period, all cross-point devices are presumed to have reverted back to the OFF state. The method 300 may include programming the crossbar array 101 with next input signal and repeating the step 302 to step 306 to calculate the Hamming distance of the next bit strings.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus comprising:
a plurality of row wires;
a plurality of column wires; and
a plurality of cross-point devices, wherein each of the plurality of cross-point devices comprises a nonpolar volatile two-terminal device located at a cross-point between a row in the plurality of row wires and a column in the plurality of column wires, and wherein each of the plurality of cross-point devices is configured to automatically revert from an ON state to an OFF state in response to a removal of a bias or signal applied on the cross-point device, wherein a summed current from the plurality of cross-point devices represents a difference between a first bit string and a second bit string, wherein a first plurality of voltages applied to the cross-point devices via the plurality of column wires corresponds to the first bit string, wherein a second plurality of voltages applied to the cross-point devices via the plurality of row wires corresponds to the second bit string.

2. The apparatus of claim 1, wherein the nonpolar volatile two-terminal device is configured to automatically reverts from the ON state to the OFF state within between 100 picoseconds and 100 milliseconds after the bias or signal applied on the nonpolar volatile two-terminal device is removed.

3. The apparatus of claim 1, wherein the nonpolar volatile two-terminal device has a nonlinearity ratio higher than 10, wherein the nonlinearity ratio corresponds to a ratio of a first current obtained on the device applied with a turn-on voltage of the nonpolar volatile two-terminal device to a second current obtained on the device applied with half of the turn-on voltage.

4. The apparatus of claim 3, wherein the nonlinearity ratio is higher than 100 when a number of the plurality of row wires and that of the plurality of column wires are more than 10.

5. The apparatus of claim 1, wherein the nonpolar volatile two-terminal device is composed of at least one of: $NbO_2$, $VO_2$, $SmNO_3$, $Ti_2O_3$, $Ti_3O_5$, $LaCoO_3$, $V_4O_7$, $NdNiO_3$, $V_6O_{11}$, real-earth metal oxide, $AM_4Q_8$ (wherein A=Ga, Ge; M=V, Nb, Ta; Q=S, Se), and a Mott material.

6. The apparatus of claim 1, wherein the nonpolar volatile two-terminal device includes a Metal-Insulator-Metal (MIM) component, wherein the MIM component includes a dielectric layer doped by a fast diffusive metal.

7. The apparatus of claim 6, wherein the fast diffusive metal comprises at least one of Ag, Cu, Au, Al, or Li.

8. The apparatus of claim 1, wherein the nonpolar volatile two-terminal device includes a Metal-Tunnel Barrier-Metal (MBM) component, wherein the MBM component includes a dielectric layer, and wherein the dielectric layer comprises at least one of: oxides, nitrides, carbides, chalcogenides, phosphorites, or sulfides.

9. The apparatus of claim 1, wherein the ON state corresponds to a low resistance state of the cross-point device, and wherein the OFF state corresponds to a high resistance state of the cross-point device.

10. The apparatus of claim 1, wherein a first cross-point device of the plurality of cross-point devices is configured to transition from a high resistance state to a low resistance state when a voltage difference between a first voltage of the first plurality of voltages and a second voltage of the second plurality of voltages is greater than a threshold switch voltage.

11. The apparatus of claim 10, wherein the voltage difference corresponds to a difference between a bit of the first bit string and a bit of the second bit string.

12. The apparatus of claim 10, wherein the high resistance state corresponds to the OFF state, and wherein the low resistant state corresponds to the ON state.

13. The apparatus of claim 1, wherein the distance between the first bit string and the second bit string comprises a Harming distance between the first bit string and the second bit string.

* * * * *